United States Patent
Sandhu et al.

(10) Patent No.: US 10,958,266 B2
(45) Date of Patent: Mar. 23, 2021

(54) PROGRAMMABLE CURRENT FOR CORRELATED ELECTRON SWITCH

(71) Applicant: Arm Limited, Cambridge (GB)

(72) Inventors: Bal S. Sandhu, Fremont, CA (US); George McNeil Lattimore, Austin, TX (US); Robert Campbell Aitken, San Jose, CA (US)

(73) Assignee: Arm Limited, Cambridge (GB)

( * ) Notice: Subject to any disclaimer, the term of this patent is extended or adjusted under 35 U.S.C. 154(b) by 0 days.

(21) Appl. No.: 16/600,366

(22) Filed: Oct. 11, 2019

(65) Prior Publication Data

US 2020/0044644 A1  Feb. 6, 2020

Related U.S. Application Data

(63) Continuation of application No. 15/659,534, filed on Jul. 25, 2017, now Pat. No. 10,447,260, which is a continuation of application No. 14/826,091, filed on Aug. 13, 2015, now Pat. No. 9,748,943.

(51) Int. Cl.

| | |
|---|---|
| *H03K 17/14* | (2006.01) |
| *G11C 13/00* | (2006.01) |
| *G11C 29/02* | (2006.01) |
| *H01L 45/00* | (2006.01) |
| *H01L 49/00* | (2006.01) |

(52) U.S. Cl.
CPC ......... *H03K 17/14* (2013.01); *G11C 13/0007* (2013.01); *G11C 13/0069* (2013.01); *G11C 29/021* (2013.01); *G11C 29/028* (2013.01); *H01L 45/149* (2013.01); *H01L 49/003* (2013.01); *G11C 2013/0078* (2013.01); *H01L 45/04* (2013.01); *H01L 45/146* (2013.01)

(58) Field of Classification Search
CPC ................. H03K 17/14; H03K 17/145; H03K 19/00369; H03K 19/00376; H03K 19/00384; H03K 2017/0806; G11C 11/5678; G11C 11/5685; G11C 13/0004; G11C 13/0002; G11C 2211/5614; G11C 2216/28; G11C 2213/71
USPC .......................... 327/378; 365/148, 159, 163
See application file for complete search history.

(56) References Cited

U.S. PATENT DOCUMENTS

| | | | |
|---|---|---|---|
| 7,872,900 B2* | 1/2011 | Paz de Araujo | ........ H01L 45/04 365/148 |
| 9,392,661 B2* | 7/2016 | Schiappelli | ...... H05B 33/01815 |
| 2006/0002172 A1 | 1/2006 | Venkataraman et al. | |
| 2010/0149861 A1 | 6/2010 | Park | |

FOREIGN PATENT DOCUMENTS

CN   104821179   8/2015

OTHER PUBLICATIONS

Examination Report under Section 18(3), International Patent Application No. GB1802330.9, dated Dec. 17, 2019, 6 pgs.

(Continued)

*Primary Examiner* — Diana J. Cheng
(74) *Attorney, Agent, or Firm* — Berkeley Law & Technology Group, LLP

(57) ABSTRACT

Subject matter disclosed herein may relate to programmable current for correlated electron switches.

17 Claims, 9 Drawing Sheets

(56) References Cited

OTHER PUBLICATIONS

Response to Examination Report under Section 18(3), International Patent Application No. GB1802330.9, filed Feb. 11, 2020, 18 pgs.
GB1802330.9: Intention to Grant Under Section 18(4) dated Jul. 30, 2020, 6 pages, Doc 1000.
GB1802330.9: Amendment filed Sep. 1, 2020, 11 pages, Doc 1001.
GB1802330.9: Voluntary Amendment Under Section 19(1) filed Sep. 8, 2020, 11 pages, Doc 1002.
TW 105125722: Office Action dated Dec. 12, 2019, 16 pages, Doc 1003.
TW 105125722: Response to Office Action filed Mar. 12, 2020, 39 pages, Doc 1004.

* cited by examiner

PROGRAMMABLE CURRENT FOR CORRELATED ELECTRON SWITCH

This application is a continuation of U.S. patent application Ser. No. 15/659,534, titled PROGRAMMABLE CURRENT FOR CORRELATED ELECTRON SWITCH, filed Jul. 25, 2017, which is a continuation of U.S. patent application Ser. No. 14/826,091, titled PROGRAMMABLE CURRENT FOR CORRELATED ELECTRON SWITCH, filed Aug. 13, 2015, both of which are incorporated herein by reference in their entirety.

BACKGROUND

Field

Subject matter disclosed herein may relate to programmable current for correlated electron switches.

Information

Integrated circuit devices, such as electronic switching devices, for example, may be found in a wide range of electronic device types. For example, memory, logic, and/or other electronic devices may incorporate electronic switches that may be used in computers, digital cameras, cellular telephones, tablet devices, personal digital assistants, etc. Factors related to electronic switching devices, such as may be incorporated in memory, logic, and/or other electronic devices, that may be of interest to a designer in considering suitability for any particular application may include physical size, storage density, operating voltages, and/or power consumption, for example. Other example factors that may be of interest to designers may include cost of manufacture, ease of manufacture, scalability, and/or reliability. Also, there appears to be an ever increasing need for memory, logic, and/or other electronic devices that exhibit characteristics of lower power and/or higher speed.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Figure 1B:
FIG. 1b depicts an example symbol for a correlated electron switch.

Reference is made in the following detailed description to accompanying drawings, which form a part hereof, wherein like numerals may designate like parts throughout to indicate corresponding and/or analogous components. It will be appreciated that components illustrated in the figures have not necessarily been drawn to scale, such as for simplicity and/or clarity of illustration. For example, dimensions of some components may be exaggerated relative to other components. Further, it is to be understood that other embodiments may be utilized. Furthermore, structural and/or other changes may be made without departing from claimed subject matter. It should also be noted that directions and/or references, for example, such as up, down, top, bottom, and so on, may be used to facilitate discussion of drawings and/or are not intended to restrict application of claimed subject matter. Therefore, the following detailed description is not to be taken to limit claimed subject matter and/or equivalents.

DETAILED DESCRIPTION

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

As utilized herein, the terms "coupled", "connected," and/or similar terms are used generically. It should be understood that these terms are not intended as synonyms. Rather, "connected" is used generically to indicate that two or more components, for example, are in direct physical, including electrical, contact; while, "coupled" is used generically to mean that two or more components are potentially in direct physical, including electrical, contact; however, "coupled" is also used generically to also mean that two or more components are not necessarily in direct contact, but nonetheless are able to co-operate and/or interact. The term coupled is also understood generically to mean indirectly connected, for example, in an appropriate context.

The terms, "and", "or", "and/or" and/or similar terms, as used herein, include a variety of meanings that also are expected to depend at least in part upon the particular context in which such terms are used. Typically, "or" if used to associate a list, such as A, B or C, is intended to mean A, B, and C, here used in the inclusive sense, as well as A, B or C, here used in the exclusive sense. In addition, the term "one or more" and/or similar terms is used to describe any feature, structure, and/or characteristic in the singular and/or is also used to describe a plurality and/or some other combination of features, structures and/or characteristics. Likewise, the term "based on" and/or similar terms are understood as not necessarily intending to convey an exclusive set of factors, but to allow for existence of additional factors not necessarily expressly described. Of course, for all of the foregoing, particular context of description and/or usage provides helpful guidance regarding inferences to be drawn. It should be noted that the following description merely provides one or more illustrative examples and claimed subject matter is not limited to these one or more illustrative examples; however, again, particular context of description and/or usage provides helpful guidance regarding inferences to be drawn.

Particular aspects of the present disclosure incorporate correlated electron material (CEM) to form a correlated electron switch (CES), such as, for example, in memory, and/or logic devices. CES devices may also be utilized in a wide range of other electronic circuit types, such as, for example, filter circuits, although the scope of claimed subject matter is not limited in scope in these respects. In this context, a CES may exhibit a substantially abrupt conductor/insulator transition arising from electron correlations rather than solid state structural phase changes (e.g., crystalline/amorphous in phase change memory (PCM) devices or filamentary formation and conduction in resistive RAM devices). In one aspect, a substantially abrupt conductor/insulator transition in a CES may be responsive to a quantum mechanical phenomenon, in contrast to melting/solidification or filament formation, for example. Such a quantum mechanical transition between conductive and insulative states, and/or between first and second impedance states, in a CES may be understood in any one of several aspects. As used herein, the terms "conductive state", "lower impedance state", and/or "metal state" may be interchangeable, and/or may at times be referred to as a "conductive/lower impedance state." Similarly, the terms "insulative state" and "higher impedance state" may be used interchangeably herein, and/or may at times be referred to as an "insulative/higher impedance state."

In an aspect, a quantum mechanical transition of correlated electron switch material between an insulative/higher impedance state and a conductive/lower impedance state may be understood in terms of a Mott transition. In a Mott transition, a material may switch from an insulative/higher impedance state to a conductive/lower impedance state if a Mott transition condition occurs. The Mott criteria is defined by $(n_c)1/^3$ a≈0.26, where $n_c$ is a concentration of electrons and "a" is the Bohr radius. When a critical carrier concentration is achieved such that the Mott criteria is met, the Mott transition will occur and the state of the CES will change from a higher resistance/higher capacitance state (that is, an insulative/higher impedance state) to a lower resistance/lower capacitance state (that is, a conductive/lower impedance state).

In another aspect, the Mott transition is controlled by a localization of electrons. When carriers are localized, the strong coulomb interaction between the electrons splits the bands of the CEM to create an insulator. When electrons are no longer localized, the weak coulomb interaction dominates and the band splitting is removed, resulting in a metal (conductive) band. This is sometimes explained as a "crowded elevator" phenomenon. While an elevator has only a few people in it, the people can move around easily, which is analogous to a conductive/lower impedance state. While the elevator reaches a certain concentration of people, on the other hand, the people can no longer move, which is analogous to the insulative/higher impedance state. However, it should be understood that this classical explanation provided for illustrative purposes, like all classical explanations of quantum phenomenon, is only an incomplete analogy, and that claimed subject matter is not limited in this respect.

Further, in an embodiment, switching from an insulative/higher impedance state to a conductive/lower impedance state may bring about a change in capacitance in addition to a change in resistance. For example, a CES may include the property of variable resistance together with the property of variable capacitance. That is, impedance characteristics of a CES device may include both resistive and capacitive components. For example, in a metal state, a CEM may have substantially zero electric field, and therefore substantially zero capacitance. Similarly, in an insulative/higher impedance state (in which electron screening may be very imperfect due to lower density of free electrons), an external electric field may be capable of penetrating the CEM and therefore the CEM will have capacitance due to a physical change in the dielectric function of the CEM. Thus, for example, a transition from an insulative/higher impedance state to a conductive/lower impedance state in a CES may result in changes in both resistance and capacitance, in an aspect.

In an embodiment, a CES device may switch impedance states responsive to a Mott-transition in a majority of the volume of the CEM of a CES device. In an embodiment, a CES device may comprise a "bulk switch." As used herein, the term "bulk switch" refers to at least a majority volume of a CEM of a CES device switching impedance states, such as responsive to a Mott-transition. For example, in an embodiment, substantially all of a CEM of a CES device may switch from an insulative/higher impedance state to a conductive/lower impedance state or from a conductive/lower impedance state to an insulative/higher impedance state responsive to a Mott-transition. In an aspect, a CEM may comprise one or more transition metal oxides, one or more rare earth oxides, one or more oxides of one or more f-block elements of the periodic table, one or more rare earth transitional metal oxide perovskites, yttrium, and/or ytterbium, although claimed subject matter is not limited in scope in this respect. In an embodiment, a device, such as CES device, may comprise CEM including one or more materials selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof, although claimed subject matter is not limited in scope in this respect.

Figure 1A:
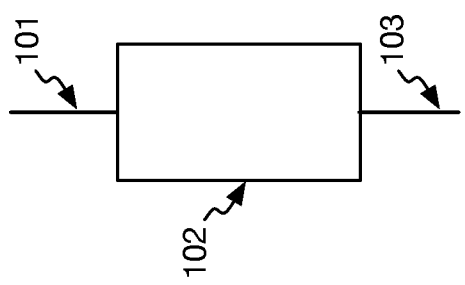
FIG. 1a shows block diagram of an example embodiment of a correlated electron switch device comprising a correlated electron material, in accordance with an embodiment.

FIG. 1a shows an example embodiment 100 of a CES device comprising CEM, such as material 102, sandwiched between conductive terminals, such as conductive terminals 101 and 103. In an embodiment, a CES device, such as CES device 100, may comprise a variable impeder device. As utilized herein, the terms "correlated electron switch" and "variable impeder" may be interchangeable. At least in part through application of a critical voltage and a critical current between the terminals, such as between conductive terminals 101 and 103, the CEM, such as material 102, may transition between the aforementioned conductive/lower impedance state and insulative/higher impedance state. As mentioned, CEM, such as material 102, in a variable impeder device, such as CES device 100, may transition between a first impedance state and a second impedance state due to a quantum mechanical transition of the correlated electron switch material as a result an applied critical voltage and an applied critical current, as described in more detail below. Also, as mentioned above, a variable impeder device, such as variable impeder device 100, may exhibit properties of both variable resistance and variable capacitance.

In a particular embodiment, a variable impeder device, such as CES device 100, may comprise a CEM that may transition between or among a plurality of detectable impedance states based, at least in part, on a transition of at least a majority portion of the CEM between an insulative/higher impedance state and a conductive/lower impedance state due to a quantum mechanical transition of the correlated electron switch material. For example, in an embodiment, a CES device may comprise a bulk switch, in that substantially all of a CEM of a CES device may switch from an insulative/higher impedance state to a conductive/lower impedance state or from a conductive/lower impedance state to an insulative/higher impedance state responsive to a Mott-transition. In this context, an "impedance state" means a detectable state of a variable impeder device that is indicative of a value, symbol, parameter and/or condition, just to provide a few examples. In one particular embodiment, as described below, an impedance state of a CES device may be detected based, at least in part, on a signal detected on terminals of the CES device in a read and/or sense operation. In another particular embodiment, as described below, a CES device may be placed in a particular impedance state to represent or store a particular value, symbol, and/or parameter, and/or to achieve a particular capacitance value for the CES device by application of one or more signals across terminals of the CES device in a "write" and/or "program" operation, for example. Of course, claimed subject matter is not limited in scope to the particular example embodiments described herein.

FIG. 1b depicts an example symbol 110 that may be utilized, for example, in electrical circuit schematic diagrams to notate a CES/variable impeder device. Example symbol 110 is meant to remind the viewer of the variable resistance and variable capacitance properties of a CES/variable impeder device, such as CES device 100. Example symbol 110 is not meant to represent an actual circuit diagram, but is merely meant as an electrical circuit diagram symbol. Of course, claimed subject matter is not limited in scope in these respects.

Figure 2:
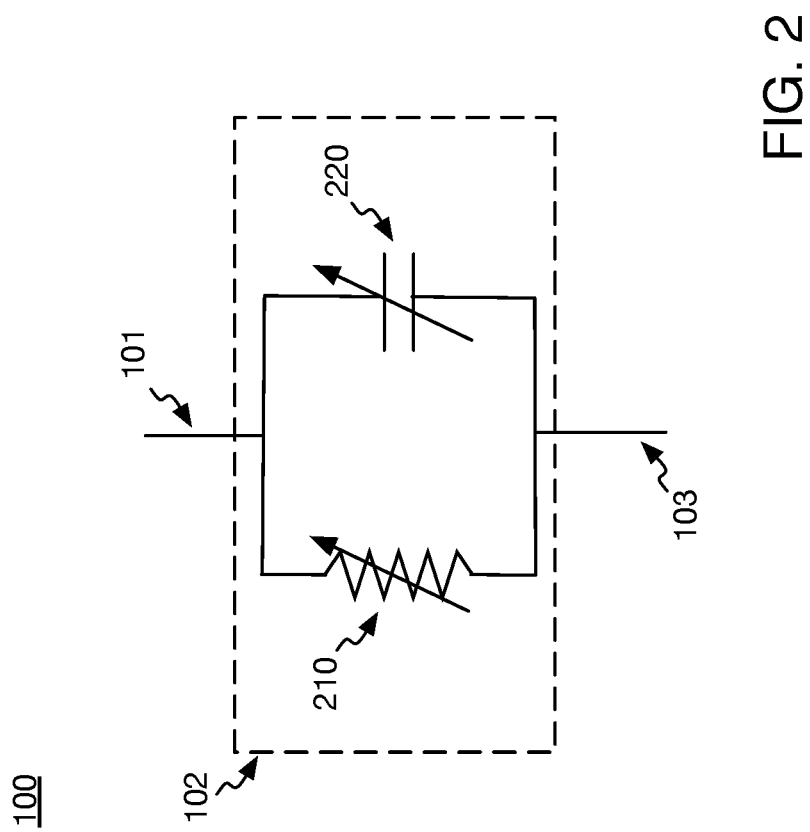
FIG. 2 depicts an example equivalent circuit for a correlated electron switch, according to an embodiment.

FIG. 2 depicts a schematic diagram of an equivalent circuit of an example CES/variable impeder device, such as CES device 100. As mentioned, a CES/variable impeder device may comprise characteristics of both variable resistance and variable capacitance. That is, the impedance characteristics for a CES/variable impeder device, such as CES device 100, may depend at least in part on the resistance and capacitance characteristics of the device. For example, an equivalent circuit for a variable impeder device may, in an embodiment, comprise a variable resistor, such as variable resistor 210 in parallel with a variable capacitor, such as variable capacitor 220. Of course, although a variable resistor 210 and variable capacitor 220 are depicted in FIG. 2 as comprising discrete components, a variable impeder device, such as CES 100, may comprise a substantially homogenous CEM, such as CEM 102, wherein the CEM comprises characteristics of variable capacitance and variable resistance.

Table 1 below depicts an example truth table for an example variable impeder device, such as CES device 100.

TABLE 1

Correlated Electron Switch Truth Table

| Resistance | Capacitance | Impedance |
|---|---|---|
| $R_{high}(V_{applied})$ | $C_{high}(V_{applied})$ | $Z_{high}(V_{applied})$ |
| $R_{low}(V_{applied})$ | $C_{low}(V_{applied})\sim 0$ | $Z_{low}(V_{applied})$ |

In an embodiment, example truth table 120 shows that a resistance of a variable impeder device, such as CES device 100, may transition between a lower resistance state and a higher resistance state that is a function, at least in part, of a voltage applied across the CEM. In an embodiment, a resistance of a lower resistance state may be 10-100,000 times lower than a resistance of a higher resistance state, although claimed subject matter is not limited in scope in this respect. Similarly, example truth table 120 shows that a capacitance of a variable impeder device, such as CES device 100, may transition between a lower capacitance state, which for an example embodiment may comprise approximately zero, or very little, capacitance, and a higher capacitance state that is a function, at least in part, of a voltage applied across the CEM. Also, as seen in Table 1, a variable impeder device transition from a higher resistance/higher capacitance state to a lower resistance/lower capacitance state may be represented as a transition from a higher impedance state to a lower impedance state. Similarly, a transition from a lower resistance/lower capacitance state to a higher resistance/higher capacitance state may be represented as a transition from a lower impedance state to a higher impedance state.

It should be noted that a variable impeder, such as CES 100, is not a resistor, but rather comprises a device having properties of both variable capacitance and variable resistance. In an embodiment, resistance and/or capacitance values, and therefore impedance values, depend, at least in part, on an applied voltage.

Figure 3:
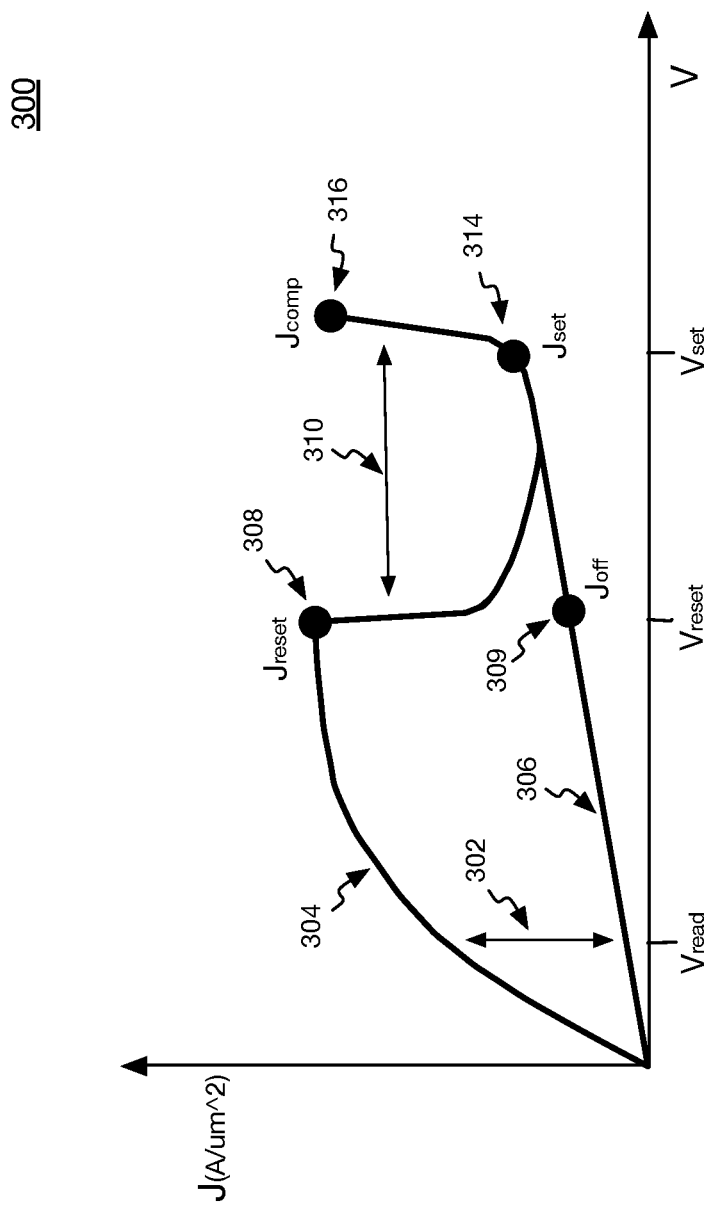
FIG. 3 shows an example plot of current density versus voltage for a correlated electron switch, according to an embodiment.

FIG. 3 shows a plot of current density versus voltage across electrically conductive terminals, such as electrically conductive terminals 101 and 103, for a CES device, such as example CES device 100, according to an embodiment. Based, at least in part, on a voltage applied to terminals of a variable impeder device (e.g., in a write operation), such as variable impeder device 100, a CEM, such as CEM 102, may be placed in a conductive/lower impedance state or an insulative/higher impedance state. For example, application of a voltage $V_{reset}$ and current density $J_{reset}$ may place the CES device in an insulative/higher impedance state, and application of a voltage $V_{set}$ and a current density $J_{set}$ may place the CES device in a conductive/lower impedance state. That is, a "set" condition may place a variable impeder device, such as CES device 100, into a conductive/lower impedance state, and a "reset" condition may place a variable impeder device, such as CES device 100, into an insulative/higher impedance state, in an embodiment. Following placement of the CES device in a lower impedance state or a higher impedance state, the particular state of the CES device may be detected at least in part by application of a voltage $V_{read}$ (e.g., in a read operation) and detection of a current or current density at terminals, such as electrically conductive terminals 101 and 103, of a variable impeder device, such as CES device 100.

In an embodiment, a CEM of a CES device may include, for example, any TMO, such as, for example, peroskovites, Mott insulators, charge exchange insulators, and/or Anderson disorder insulators. In a particular embodiment, a CES device may be formed from materials such as nickel oxide, cobalt oxide, iron oxide, yttrium oxide and peroskovites such as Cr doped strontium titanate, lanthanum titanate, and the manganite family including praesydium calcium manganite, and praesydium lanthanum manganite, to provide a few examples. In an embodiment, oxides incorporating elements with incomplete d and f orbital shells may exhibit sufficient impedance switching properties for use in a CES device. In an embodiment, a CES may be prepared without electroforming. Other embodiments may employ other transition metal compounds without deviating from claimed subject matter. For example, {M(chxn)$_2$Br}Br$_2$ where M may comprise Pt, Pd, or Ni, and chxn comprises 1R,2R-cyclohexanediamine, and other such metal complexes may be used without deviating from the scope of claimed subject matter.

In one aspect, the CES device of FIG. 1 may comprise materials that comprise TMO metal oxide variable impedance materials, though it should be understood that these are exemplary only, and are not intended to limit the scope of claimed subject matter. Particular implementations may employ other variable impedance materials as well. Nickel oxide, NiO, is disclosed as one particular TMO. NiO materials discussed herein may be doped with extrinsic ligands, which may stabilize variable impedance properties by passivating the interfacing and allowing for adjustable voltages and impedances, in an embodiment. In a particular embodiment, NiO variable impedance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences, in an embodiment. In another particular example embodiment, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences, in an embodiment.

According to an embodiment, if sufficient bias is applied (e.g., exceeding a band-splitting potential) and the aforementioned Mott condition is met (injected electron holes=the electrons in the switching region), the CES device may rapidly switch from a conductive/lower impedance state to an insulator state via the Mott transition. This may occur at point 308 of the plot in FIG. 3. At this point, electrons are no longer screened and become localized. This correlation splits the bands to form an insulator. While the CEM of the CES device is still in the insulative/higher impedance state, current may generated by transportation of holes. If enough bias is applied across terminals of the CES device, electrons may be injected into a metal-insulator-metal (MIM) diode over the potential barrier of the MIM device. If enough electrons have been injected and enough potential is applied across terminals to achieve a set condition, an increase in electrons may screen electrons and remove a localization of electrons, which may collapse the band-splitting potential forming a metal, thereby placing the CES device in a conductive/lower impedance state.

According to an embodiment, current in a CEM of a CES device may be controlled by an externally applied "compliance" condition determined based, at least in part, on the external current limited during a write operation to achieve a set condition to place the CES device in a conductive/lower impedance state. This externally applied compliance current also sets the subsequent reset condition current density requirement. As shown in the particular implementation of FIG. 3, a current density J$_{comp}$ applied during a write operation at point 316 to place the CES device in a conductive/lower impedance state may determine a compliance condition for placing the CES in an insulative/higher impedance state in a subsequent write operation. As shown, the CEM of the CES device may be subsequently placed in an insulative/higher impedance state by application of a current density J$_{reset}$≥J$_{comp}$ at a voltage V$_{reset}$ at point 308, wherein J$_{comp}$ may be externally applied, in an embodiment.

A compliance current, such as an externally applied compliance current, therefore may set a number of electrons in a CEM of a CES device which are to be "captured" by holes for the Mott transition. In other words, a current applied in a write operation to place a CES device in a conductive/lower impedance state may determine a number of holes to be injected to the CEM of the CES device for subsequently transitioning the CES device to an insulative/higher impedance state. As discussed more fully below, a compliance current may be applied dynamically.

As pointed out above, a transition to an insulative/higher impedance state may occur in response to a Mott transition at point 308. As pointed out above, such a Mott transition may occur at a condition in a CEM of a CES device in which a concentration of electrons n equals a concentration of electron holes p. This condition occurs when the following Mott criteria is met, as represented by expression (1) as follows:

$$\lambda_{TF} n^{\frac{1}{3}} = C \sim 0.26 \quad (1)$$

$$n = \left(\frac{C}{\lambda_{TF}}\right)^3$$

where:
$\lambda_{TF}$ is a Thomas Fermi screening length; and
C is a constant which equals approximately 0.26 for the Mott transition.

According to an embodiment, a current or current density in a region 304 of the plot shown in FIG. 3 may exist in response to an injection of holes from a voltage signal applied across terminals, such as terminals 101 and 103, of a variable impeder device, such as CES device 100. Here, injection of holes may meet a Mott transition criterion for the conductive to insulator transition at current I$_{MI}$ as a critical voltage V$_{MI}$ is applied across terminals, such as terminal 101 and 103, of a variable impeder device, such as CES device 100. This may be modeled according to expression (2) as follows:

$$I_{MI}(V_{MI}) = \frac{dQ(V_{MI})}{dt} \approx \frac{Q(V_{MI})}{t} \quad (2)$$

$$Q(V_{MI}) = qn(V_{MI})$$

Where Q(V$_{MI}$) is the charge injected (hole or electron) and is a function of the applied voltage. As used herein, the notation "MI" signifies a metal-to-insulator transition, and the notation "IM" signifies an insulator-metal transition. That is, "VI" refers to a critical voltage and "$I_{MI}$" refers to a critical current to transition a CEM from a conductive/lower impedance state to an insulative/higher impedance state. Similarly, "$V_{IM}$" refers to a critical voltage and "$I_{IM}$" refers to a critical current to transition a CEM from an insulative/higher impedance state to a conductive/lower impedance state.

Injection of holes to enable a Mott transition may occur between bands and in response to critical voltage $V_{MI}$ and critical current $I_{MI}$. By equating electron concentration n with the needed charge concentration to result in a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \quad (3)$$

$$J_{reset}(V_{MI}) = J_{MI}(V_{MI}) = \frac{I_{MI}(V_{MI})}{A_{CEM}} = \frac{q}{A_{CEM}t}\left(\frac{C}{\lambda_{TF}(V_{MI})}\right)^3$$

Wherein $A_{CEM}$ is a cross-sectional area of a CEM, such as CEM 102, of a variable impeder device, such as CES device 100, and wherein $J_{reset}(V_{MI})$, depicted at point 308 of example plot 300, is a current density through the CEM, such as CEM 102, to be applied to the CEM at a critical voltage $V_{MI}$ to place the CEM of the CES device in an insulative/higher impedance state. In an embodiment, a CEM may be switched between a conductive/lower impedance state and an insulative/higher impedance state at least in part by a disproportionation reaction.

According to an embodiment, a CEM, such as CEM 102, of a variable impeder device, such as CES device 100, may be placed in a conductive/lower impedance state (e.g., by transitioning from an insulative/higher impedance state) by injection of a sufficient number of electrons to satisfy a Mott transition criteria.

In transitioning a CEM of a CES device to a conductive/lower impedance state, as enough electrons have been injected and the potential across terminals of the variable impeder device overcomes a critical switching potential (e.g., $V_{set}$), injected electrons begin to screen and unlocalize double-occupied electrons to reverse a disproportion reaction and closing the bandgap. A current density $J_{set}(V_{MI})$, depicted at point 314 of FIG. 3, for transitioning the CEM of the CES device to the conductive/lower impedance state in a metal-insulator Mott transition at a critical voltage $V_{MI}$ enabling transition to the conductive/lower impedance state may be represented according to expressions (4) as follows:

$$I_{MI}(V_{MI}) = \frac{dQ(V_{MI})}{dt} \approx \frac{Q(V_{MI})}{t} \quad (4)$$

$$Q(V_{MI}) = qn(V_{MI})$$

$$I_{MI}(V_{MI}) = \frac{Q(V_{MI})}{dt} = \frac{qn(V_{MI})}{t} = \frac{q}{t}\left(\frac{C}{a_B}\right)^3$$

$$J_{reset}(V_{MI}) =$$

$$J_{injection}(V_{IM}) = J_{IM}(V_{IM}) = \frac{I_{IM}(V_{IM})}{A_{CEM}} = \frac{q}{A_{CEM}t}\left(\frac{C}{a_B}\right)^3$$

where:
$a_B$ is a Bohr radius.

According to an embodiment, a "read window" 302 for detecting a memory state of a CES device in a read operation may be set out as a difference between a portion 306 the plot of FIG. 3 while the CEM of the CES device is in an insulative/higher impedance state and a portion 304 of the plot FIG. 3 while the CEM of the CES device is in a conductive/lower impedance state at a read voltage $V_{read}$. In a particular implementation, read window 302 may be used to determine the Thomas Fermi screening length $\lambda_{TF}$ of a CEM, such as correlated electron switch material 102, of a variable impeder device, such as CES device 100. For example, at a voltage $V_{reset}$, current densities $J_{reset}$ and $J_{set}$ may be related to according to expression (5) as follows:

$$\lambda_{TF}(@V_{reset}) = a_B\left(\frac{J_{reset}}{J_{off}}\right)^{\frac{1}{3}} \quad (5)$$

wherein $J_{off}$ represents a current density of a CEM in an insulative/higher impedance state at $V_{reset}$. See, for example, point 309 of FIG. 3.

In another embodiment, a "write window" 310 for placing a CEM of CES device in an insulative/higher impedance or conductive/lower impedance state in a write operation may be set out as a difference between $V_{reset}$ and $V_{set}$. Establishing $|V_{set}|>|V_{reset}|$ may enable a switch between the conductive/lower impedance and insulative/higher impedance state. $V_{reset}$ may comprise approximately the band splitting potential caused by the correlation and $V_{set}$ may comprise approximately twice the band splitting potential, such that the read window may comprise approximately the band-splitting potential. In particular implementations, a size of write window 310 may be determined, at least in part, by materials and doping of the CEM of the CES device.

In an embodiment, a process for reading a value represented as an impedance state of a variable impeder device, such as CES device 100, may comprise a voltage being applied to a CEM of a CES device. At least one of a current and/or current density within a CEM of a CES device may be measured, and an impedance state of a CEM of a CES device may be determined, at least in part, on the measured current and/or current density, in an embodiment.

Additionally, in an embodiment, an impedance of an impedance state may depend at least in part on a combination of a capacitance and a resistance of a CEM of a CES device. In an embodiment, the determined impedance state may comprise one of a plurality of impedance states. A first impedance state may comprise a lower resistance and lower capacitance, and a second impedance state may comprise a higher resistance and a higher capacitance, for example. Also, in an embodiment, a ratio of the impedances of the plurality of impedance states may be proportional to a physical property of the CEM of the CES device. In an embodiment, the physical property of the CEM of the CES device may comprise at least one of a Thomas Fermi screening length and a Bohr radius. Further, in an embodiment, individual impedance states of the plurality of impedance states may be associated with a data value. Additionally, in an embodiment, a difference in current between a first impedance state and a second impedance state at a predetermined voltage provides an indication of a read window. However, claimed subject matter is not limited in scope in these respects.

In an embodiment, a plurality of electrons may be provided to a CEM of a CES device such that the CES enters a first impedance state. A plurality of holes may be provided to the CEM such that the CES enters a second impedance state. Also, in an embodiment, the plurality of electrons may cause a voltage across the CES to be greater than a set voltage threshold, and the plurality of holes may cause the voltage across the CES to be equal to or greater than a reset voltage threshold. Further, in an embodiment, a voltage across the CEM may cause a current density in the CEM to be equal to or greater than a set current density and/or a set current, and a voltage across the CEM may cause a current density in the CEM to be equal to or greater than a reset current density and/or a reset current.

Also, in an embodiment, a set voltage across the CEM and a set current density through a CEM of a CES device may be exceeded. Additionally, a reset voltage across a CEM and a reset current density through a CEM of a CES device may be exceeded. Further, in an embodiment, individual impedance states of a plurality of impedance states may be associated with a data value.

In an embodiment, at least one of a reset voltage, a set voltage, and a difference between the set voltage and the reset voltage are proportional to a physical property of a CEM of a CES device. A physical property of a CEM may include at least one of a strong electron potential due to localization, and/or a correlation of electrons, for example. Also, in an embodiment, a difference in the set voltage and the reset voltage may provide an indication of a size of at least one of a write/program window.

Figure 4:
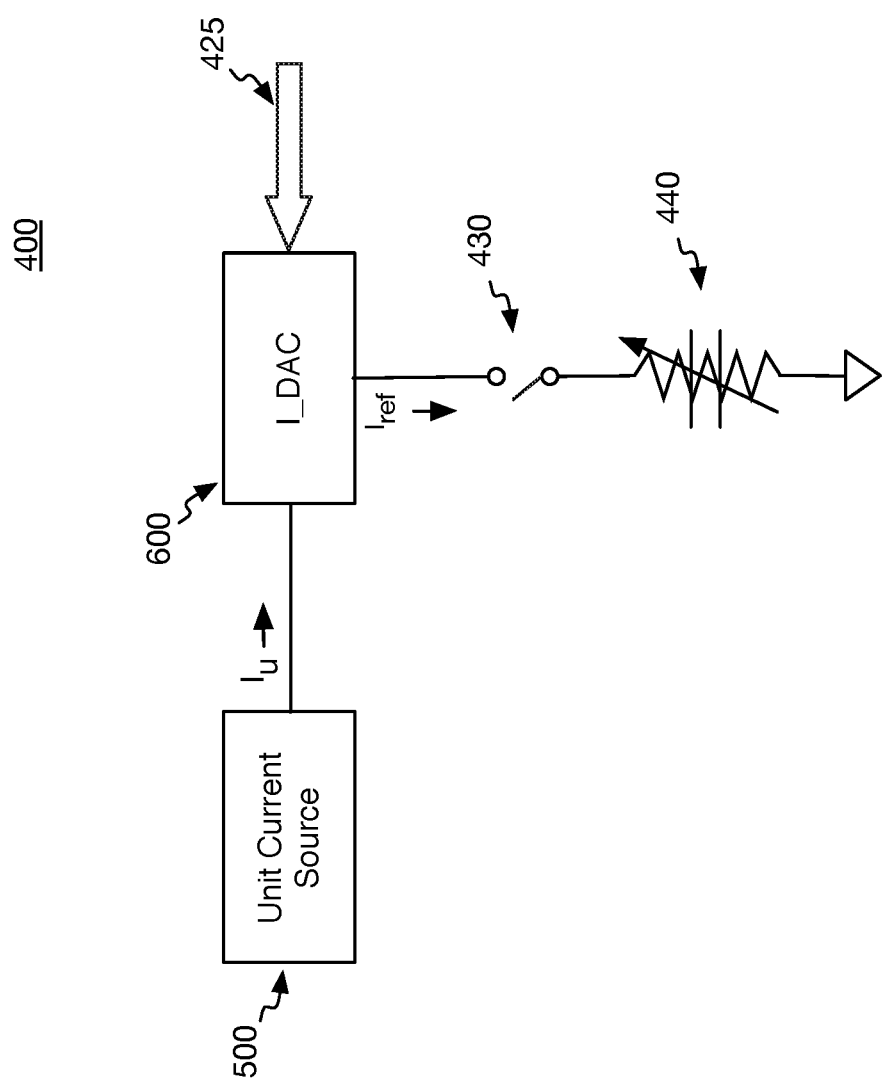
FIG. 4 depicts a schematic block diagram of an example circuit for providing a programmable current for a correlated electron switch, in accordance with an embodiment.

FIG. 4 depicts a schematic block diagram of an example embodiment 400 of a circuit for providing a programmable current for a variable impeder device, such as CES device 100, in accordance with an embodiment. As mentioned above, transitioning a variable impeder device, such as CES device 100, from conductive/lower impedance state to an insulative/higher impedance state (i.e., a reset condition) or from an insulative/higher impedance state to a conductive/lower impedance state (i.e., a set condition) may require a current through a CES device sufficient to cause a Mott or Mott-like transition to occur in the CEM of the CES device at a given voltage. As can be seen in FIG. 3, different amounts of current/current density and/or voltage may be applied to a CES to cause particular impedance state transitions. For example, as seen in FIG. 3, to achieve a reset condition to cause a transition from a conductive/lower impedance state to an insulative/higher impedance state, a voltage $V_{reset}$ may be applied across a CES device, and a current density $J_{reset}$ may be achieved in the CES device. Both the voltage and current conditions need to be met, in an embodiment, before a reset condition can be achieved resulting in a transition from a conductive/lower impedance state to an insulative/higher impedance state. Similarly, as also seen in FIG. 3, to achieve a set condition to cause a transition from an insulative/higher impedance state to a conductive/lower impedance state, a voltage $V_{set}$ may be applied across a CES device, and a current density $J_{set}$ may be achieved in the CES device. Again, both the voltage and current conditions need to be met, in an embodiment, before a set condition can be achieved resulting in a transition from an insulative/higher impedance state to a conductive/lower impedance. Also, it may be noted that different current and/or voltage levels may be needed for set and reset conditions, in an embodiment.

To produce different levels of current in a variable impeder device, such as CES 100, example circuit 400 for providing a programmable current to a CES device, such as CES device 440 depicted in FIG. 4, may comprise an example current source, such as unit current source 500, coupled to an example programmable current source, such as digital-to-analog converter current source (I_DAC) 600. In an embodiment, unit current source 500 may provide an amount of current, such as a "unit" amount, to a programmable current source, such as I_DAC 600. Also, in an embodiment, a programmable current source, such as I_DAC 600, may provide multiples of a unit current, such as provided by unit current source 500, for example, to a CES device, such as CES device 440. As depicted in FIG. 4, a programmable current for a CES device, such as CES device 440, may be referred to as a reference current ($I_{ref}$) although claimed subject matter is not limited in scope in this respect.

Example circuit 400 may further include an enable switch, such as switch 430, that may couple a programmable current source, such as I_DAC 600, to a variable impeder device, such as CES device 440, in an embodiment. For example, for a read operation involving CES device 440, switch 430 may remain open, thereby decoupling the output of I_DAC 600 from CES device 440 during the read operation. For a write operation, switch 430 may be closed to allow I_DAC 600 to provide a current for a set or reset condition, as appropriate. In an embodiment, switch 430 may comprise a transistor that may conduct in response to an enable signal, for example.

As depicted in FIG. 4, a digital code 425 may be provided to a programmable current source, such as I_DAC 600, in an embodiment. For example, a programmable current device, such as I_DAC 600, may generate various levels of current in accordance with a digital code, such as digital code 425. In an embodiment, a first current level appropriate for a set condition (i.e., a transition from an insulative/higher impedance state in a CES device) may be specified by a first digital code, and a second current level appropriate for a reset condition (i.e., a transition from a conductive/lower impedance state in a CES device) may be specified by a second digital code. Current levels for set and/or reset conditions may be adjusted if desirable, such as to compensate for variations in process, voltage, and/or temperature, for example, by adjusting the digital code, in an embodiment. In this manner, a programmable current source, such as I_DAC 600, may be programmed and/or adjusted to generate currents for set and/or reset conditions for a variable impeder device, such as CES device 440.

In an embodiment, unit current source 500 may generate a unit current ($I_u$), and a programmable current source, such as I_DAC 600, may generate multiples of the unit current (10. Also, in an embodiment, a multiple of the unit current may be specified, at least in part, by a digital code, such as digital code 425. For example, a first plurality of bits of a digital code, such as digital code 425, may specify a first multiple of a unit current to be provided to a variable impeder device, such as CES device 440, for a set condition, and a plurality of bits of a digital code, such as digital code 425, may specify a second multiple of a unit current to be provided to a variable impeder device, such as CES device 440, for a reset condition. In an embodiment, an amount of current provided to a variable impeder device, such as CES device 440, for a reset condition may be greater than an amount of current provided to a variable impeder device, such as CES device 440, for a set condition. That is, for a write operation including a reset condition, a digital code, such as digital code 425, may specify a greater multiple of a unit current to be provided to a variable impeder device, such as CES device 440, than for a set condition, in an embodiment. Also, although multiples of unit currents related to programmable current sources are described herein, other embodiments may provide for generation of programmable currents that are not based on multiples of unit currents, for example.

In an embodiment, a digital code, such as digital code 425, may comprise one or more bits to specify adjustments to current levels to compensate, at least in part, for variations in process, voltage, and/or temperature. For example, an amount of current and/or current density needed for a reset condition in a particular CES device may depend, at least in part, on the particular composition of the correlated electron material of that CES device. Variations may occur during a fabrication process that may change the amount of current and/or current density that may be achieved to accomplish a set and/or reset condition, for example. Such variations in the Jset and/or Jreset points for a particular CES device may be compensated for in a programmable current source by adjusting the digital code provided to the programmable current source.

Additionally, although I_DAC 600 is depicted as a single digital-to-analog current converter, embodiments in accordance with claimed subject matter are not so limited. For example, in another embodiment, an N-bit coarse-tuning DAC may by utilized to adjust a programmable current for a set condition, and an M-bit fine-tuning DAC may further adjust the programmable current for a reset condition. Also, in an embodiment, an M-bit fine-tuning DAC may be utilized to adjust for variations in process, voltage, and/or temperature. Of course, claimed subject matter is not limited in scope in these respects.

Figure 5:
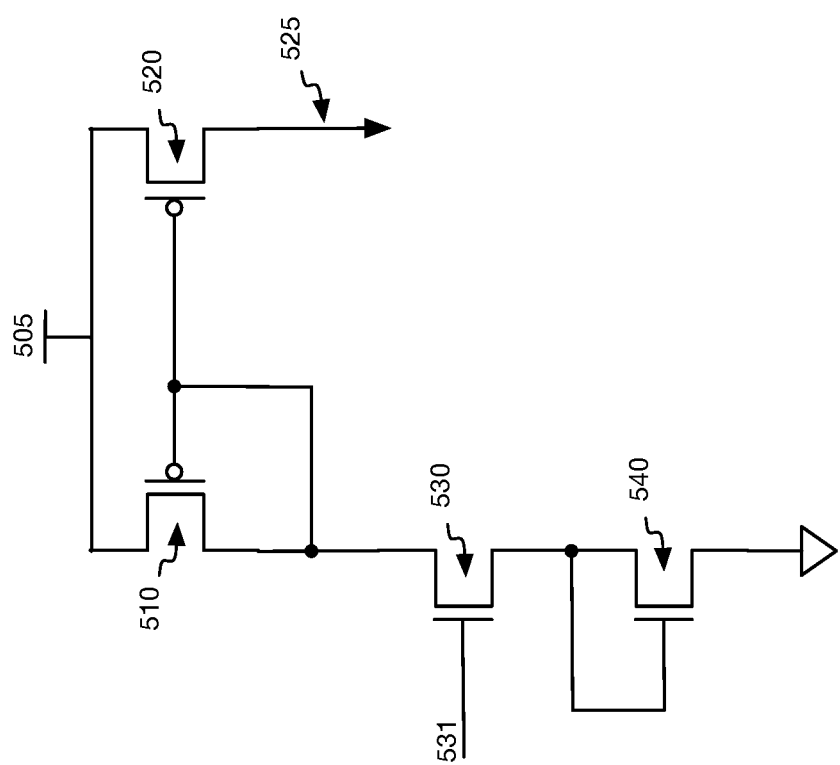
FIG. 5 depicts a schematic diagram of an example current source, in accordance with an embodiment.

FIG. 5 depicts a schematic diagram of an example embodiment 500 of a unit current source, in accordance with an embodiment. In an embodiment, a pair of conductive elements, such as transistors 510 and 520, may comprise a current mirror circuit. A supply voltage 505 may also be provided to the current mirror circuit. An output current 525 may be generated as an output of the current mirror comprising transistors 510 and 520, for example. Unit current source 500 may also comprise an enable switch, such as transistor 530, to couple a current source, such as transistor 540, to the current mirror formed by transistors 510 and 520. In an embodiment, transistor 530 may be enabled in response to an assertion of an enable signal 531. Also, in an embodiment, an amount of current generated for output current 525 may depend at least in part on characteristics of transistor 540, transistor 510, and/or transistor 520. Also, in an embodiment, an amount of current generated for output current 525 may be referred to as a unit level of current. In an embodiment, a unit current may comprise approximately 10 uA, and in another embodiment a unit current may comprise approximately 1.0 uA. However, claimed subject matter is not limited in scope in these respects. As explained more fully below, a unit current, such as output current 525, may be further multiplied by passing through a digital-to-analog current converter, such as example I_DAC 600 described below.

Figure 6:
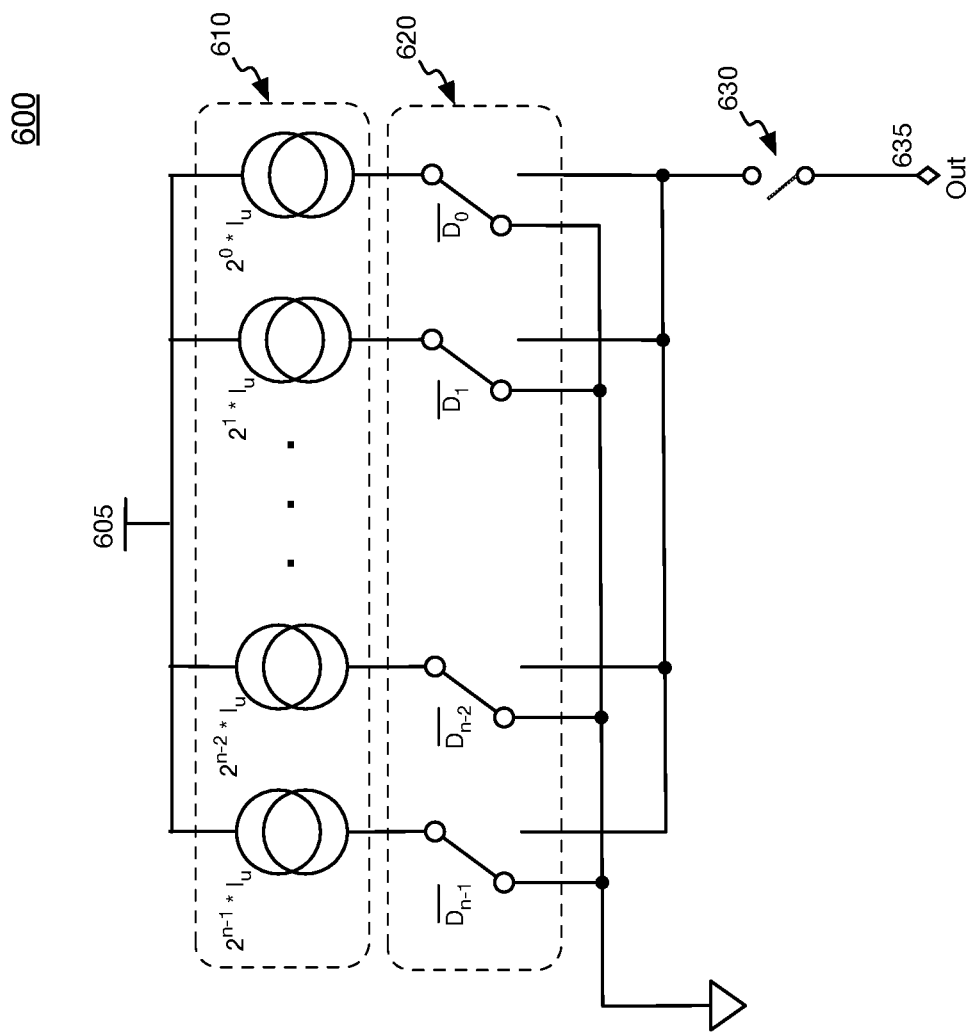
FIG. 6 depicts a schematic diagram of an example digital-to-analog converter for an example programmable current source, in accordance with an embodiment.

FIG. 6 depicts a schematic diagram of an embodiment 600 of an example digital-to-analog current converter (I_DAC) for an example programmable current source, in accordance with an embodiment. In an embodiment, I_DAC 600 may comprise an n-bit DAC. In an embodiment, for individual bits of an n-bit digital code that comprise a binary value of "1", for example, a corresponding switch in current steering block 620 may enable a corresponding current source in current source block 610 to provide its current to output signal 635, assuming that enable switch 630 is closed. For example, if a digital code, such as digital code 425, includes "0" values for all bits, current from current source block 610 may be dumped to ground or to some other reference voltage. Also, for example, if a $0^{th}$ bit ($D_0$) of an n-bit digital code comprises a value of "1", an amount of current $2^0 * I_u$ may be steered to output 635 through enable switch 630. Additionally, for example, if a $1^{st}$ bit ($D_1$) of an n-bit digital code comprises a value of "0", an amount of current $2^1 * I_u$ may be dumped to GND or to another reference node. Further, for this example, if a $2^{nd}$ bit ($D_2$) of the n-bit digital code comprises a value of "1", an amount of current $2^2 * I_u$ may be steered to output 635 through enable switch 630. Thus, for an example digital code of 101b for a 3-bit DAC, an amount of current approximately equal to $2^0 * I_u + 2^2 * I_u$ may be steered to output 235. If a current unit comprises 10 uA, for example, a current of approximately 50 uA may be generated at output 635, although of course claimed subject matter is not limited in scope in these respects. For an example digital code of all "1" values, all of the current sources in current source block 610 may be coupled to output 635, and a maximum current may be generated at output 635, in an embodiment.

In an embodiment, enable switch 630 may be closed for programming operations for a corresponding CES device, such as CES device 440. For a read operation for a corresponding CES device, such as CES device 440, enable switch 630 may be opened to prevent the programmable current at output 635 from interfering with the read operation.

Also, although example I-DAC 600 is described as a binary-weighted current converter, embodiments in accordance with claimed subject matter are not so limited. Example embodiments may employ any technique or circuit to generate programmable current values, such as in accordance with a digital code. For example, non-binary weighted DACs may be utilized in one or more embodiments.

In one or more embodiments, a digital code, such as digital code 425, may be derived and/or generated from any of a range of different sources. For example, a digital code, such as digital code 425, may comprise extended memory address ("EMA") inputs in implementations where one or more variable impeder devices are utilized in a memory device. Historically, EMA inputs for memory systems comprised static address bits that controlled the timing of sense amps and/or of write word-lines, for example. EMA bits may have been set to some default value that may correspond to a nominal design point. However, non-default values allowed for the tuning of particular circuits to account for relatively small variations in speed-up and/or slow-down related to the timing of the particular circuits. Non-default values also allowed for functional corrections in the event of more major variations due to hardware problems, for example.

In an embodiment, a plurality of address bits may be utilized to deliver a digital code, such as digital code 425, to a programmable current source for one or more variable impeder devices, such as CES 440. In an embodiment, a digital code may be provided to a plurality of address inputs of a memory device, for example, although claimed subject matter is not limited in scope in this respect. In an embodiment, a first subset of address bits of a digital code may represent a coarse-tuning value for a programmable current source, and a second subset of address bits of the digital code may represent a fine-tuning value for the programmable current source. In an embodiment, a plurality of address bits, including, for example, a subset of bits for coarse tuning and/or a subset of bits for fine-tuning, may allow for tuning of currents for a number of different situations related to variable impeder devices, such as CES 440. For example, a plurality of address bits may allow for tuning of a read current, a set current, and/or a reset current for a variable impeder device, such as CES 440. The tuning abilities would provide for not only tuning to account for different current requirements for read, set, and/or reset conditions, but would also allow for tuning to provide a number of options around statistical worst-case, or best-case as needed, current requirements. For example, coarse-tuning abilities may allow for more major unforeseen process variations wherein the currents for read, set, and/or reset conditions may need to be increased significantly for functionality. Also, for example, fine-tuning abilities may allow for more minor process variations and/or variations in voltage and/or temperature, in an embodiment.

In an embodiment, address bits utilized to communication a digital code, such as digital code 425, for a variable impeder device, such as CES device 440, may remain constant, or in a direct current (DC) state, during static timing analysis. In another embodiment, address bits of a digital code may be allowed to switch during a functional cycle as long as setup and/or hold times appropriate for a given memory technology and/or layout are met, for example.

Figure 7:
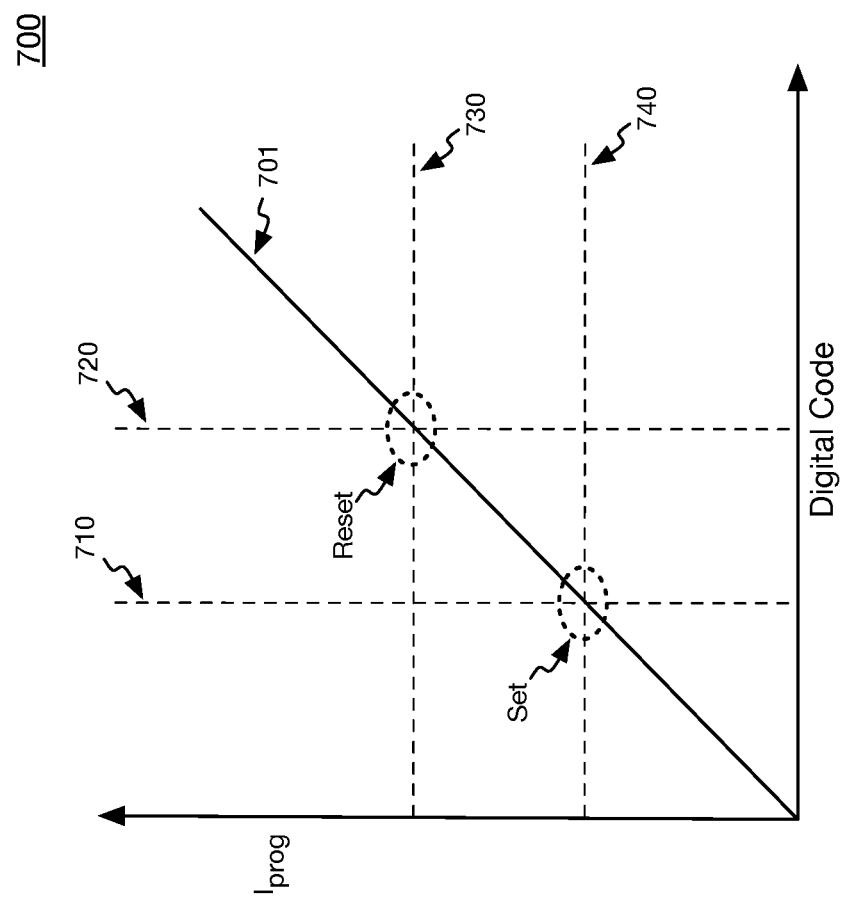
FIG. 7 shows an example plot depicting current vs. digital code for an example programmable current source for a correlated electron switch, in accordance with an embodiment.

FIG. 7 shows an example plot 700 depicting current vs. digital code for an example programmable current source, such as I_DAC 600, for a variable impeder device, such as CES 440, in accordance with an embodiment. Example plot 700 depicts an example programmable current 701 that may be generated, for example, by a programmable current source, such as I_DAC 600, as a function of a digital code, such as digital code 425. As mentioned previously, there are two main transition points for a variable impeder device, such as CES device 440, including a set point and a reset point. In an embodiment, a first value of a digital code, such as digital code value 710, may specify a particular current level, such as current level 740, to cause a variable impeder device, such as CES device 440, to achieve a set condition and therefore to transition from an insulative/higher impedance state to a conductive/lower impedance state. Also, in an embodiment, a second value of a digital code, such as digital code value 720, may specify a particular current level, such as current level 730, to cause a variable impeder device, such as CES device 440, to achieve a reset condition and therefore to transition from a conductive/lower impedance state to an insulative/higher impedance state. As mentioned, specific digital codes for set and/or reset conditions may be adjusted to account for variations in process, voltage, and/or temperature, in an embodiment.

In an embodiment, a current for a set region may be controlled by an n-bit DAC and a current for a reset region may be controlled by an m-bit DAC, for example. Also, in an embodiment, the number of bits dedicated for specification of currents for set and/or reset conditions may be a function, at least in part, of anticipated variations in the set and/or reset points, such as due to variations in process, voltage, and/or temperature. Also, the total number of bits of a digital code, such as digital code 425, may be determined, at least in part, by an anticipated maximum amount of current that may be needed to achieve a reset condition in a variable impeder device, such as CES 440. Of course, claimed subject matter is not limited in scope to the particular examples provided herein. For example, digital codes to specify programmable current levels for a programmable current source for one or more variable impeder devices may include a wide range of numbers of bits, and/or may comprise a wide range of different configurations, in one or more embodiments.

Figure 8:
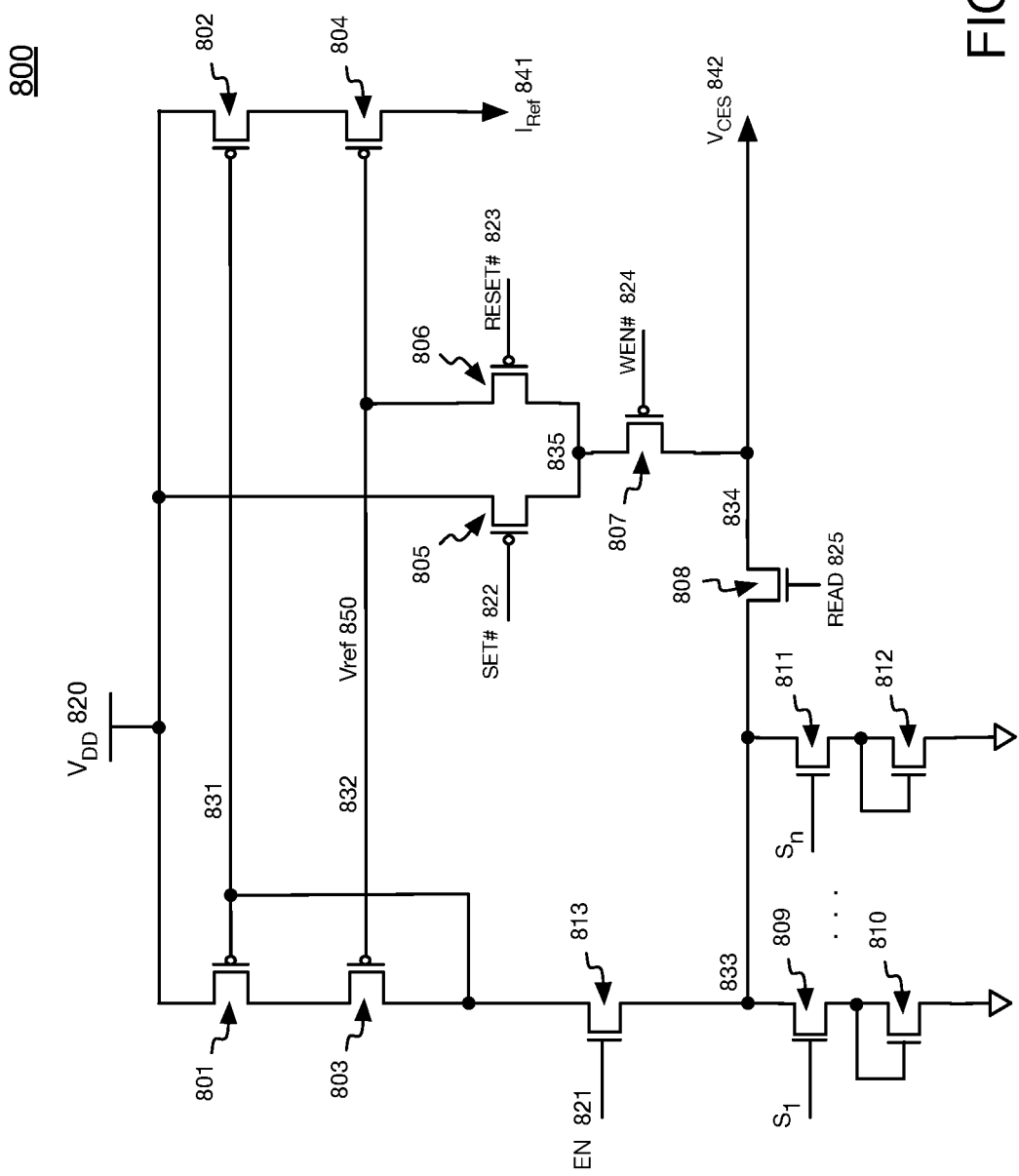
FIG. 8 is a schematic diagram of an example circuit for providing a programmable current for a correlated electron switch device, in accordance with an embodiment.

FIG. 8 is a schematic diagram of an embodiment 800 of an example circuit for providing a programmable current, such as reference current ($I_{ref}$) 841, that may be applied to one or more variable impeder devices, such as CES device 440, in an embodiment. As explained more fully below, example circuit 800 may also be utilized to provide voltages for read, set, and/or reset conditions for one or more variable impeder devices, such as CES device 440. In an embodiment, conductive elements 801 and 802 may comprise a first current mirror stage, and conductive elements 803 and 804 may comprise a second current mirror stage that may generate reference current 841 at least in part in response to conductive element 813 being enabled through assertion of an enable signal (EN) 821. In an embodiment, a supply voltage $V_{DD}$ 820 may be applied to the first current mirror stage including conductive elements 801 and 802. A reference voltage $V_{ref}$ 850 may drive the second current mirror stage including conductive elements 803 and 804, for example. Also, in an embodiment, $V_{ref}$ 850 may comprise an analog reference voltage that may be generated by an analog bias voltage generator (not shown). Further, in an embodiment, $V_{DD}$ 820 may comprise approximately 1.2V and $V_{ref}$ 850 may comprise approximately 0.6V, although claimed subject matter is not limited in scope in these respects. In an embodiment, conductive elements 801, 802, 803, and 804 may comprise p-channel metal oxide semiconductor (PMOS) transistors, and conductive element 813 may comprise an n-channel metal oxide semiconductor (NMOS) transistor.

In an embodiment, reference current 841 may be utilized for writing to a variable impeder device, such as CES device 440. Also, in an embodiment, different current levels and/or current densities may be achieved in a variable impeder device, such as CES device 440, by enabling different amounts of current source devices 810 through 812. For example, one or more of a plurality of selector signals $S_1$ through $S_n$ may be individually asserted to individually enable one or more current source devices 810 through 812 through one or more conductive elements 809 through 811, in an embodiment. For example, particular current source elements may be enabled through assertion of particular select signals $S_1$ through $S_n$, depending on a particular digital code, such as digital code 425, that may be specified. In this manner, various current levels may be specified by different digital code values, and corresponding current levels for reference current 841 may be generated, in an embodiment. In an embodiment, conductive elements 809 through 811 and current source devices 810 through 812 may comprise an n-bit digital-to-analog current converter, similar to that disclosed above in connection with FIG. 6, for example. Embodiments in accordance with claimed subject matter may include a wide range of amounts of current source devices 810 through 812 and/or conductive elements 809 through 811, for example, depending at least in part on anticipated and/or specified current and/or current density requirements for one or more particular variable impeder devices. Also, in an embodiment, conductive elements 809 through 811 may comprise NMOS transistors. Current source devices 810 through 812 may also comprise NMOS transistors, in an embodiment.

In an embodiment, a voltage on node 833 of example circuit 800 may be coupled to an output node 834 at least in part in response to a conductive element 808 becoming enabled by assertion of a Read signal 825. In an embodiment, conductive element 808 may comprise an NMOS transistor. Also, in an embodiment, for a variable impeder device read operation, EN 821 and Read 825 may be asserted. In an embodiment, a read voltage, such as may be developed on node 833, may be adjusted from approximately 0.2V to 0.4V, for example, depending on which select signals $S_1$ through $S_n$ are asserted as specified by a digital code, such as digital code 425.

Also, in an embodiment, a conductive element 805 may couple $V_{DD}$ 820 to a node 835 at least in part in response to an assertion of a set signal Set #822. In an embodiment, conductive element 805 may comprise a PMOS transistor, and Set #822 may be asserted by pulling the signal to a logically low voltage level. Additionally, in an embodiment, a conductive element 806 may couple $V_{ref}$ 850 to node 835 at least in part in response to an assertion of a reset signal Reset #823. In an embodiment, conductive element 806 may comprise a PMOS transistor, and Reset #823 may be asserted by pulling the signal to a logically low voltage level. Further, in an embodiment, node 835 may be coupled to output node 834 by enablement of conductive device 807 at least in part in response to an assertion of a write enable signal WEN #824. In an embodiment, conductive element 807 may comprise a PMOS transistor, and WEN #823 may be asserted by pulling the signal to a logically low voltage level.

In an embodiment, conductive elements 822, 823, and 824 may be utilized to perform write operations for a variable impeder device, such as CES device 440, for example. An output voltage $V_{CES}$ 842 may be developed on output node 834 and may be applied to a variable impeder device, such as CES device 440, during write/programming operations, for example. In an embodiment, for a write operation, conductive element 807 may be enabled through assertion of WEN #824, and one of conductive elements 805 or 806 may be enabled, depending on whether a set or reset operation is specified. For a set operation (i.e., to transition a variable impeder device from an insulative/higher impedance state to a conductive/lower impedance state), Set #822 may be enabled to couple $V_{DD}$ 820 to output node 834. For a reset operation (i.e., to transition a variable impeder device from a conductive/lower impedance state to an insulative/higher impedance state), Reset #823 may be enabled to couple $V_{ref}$ 850 to output node 834, in an embodiment.

Figure 9:
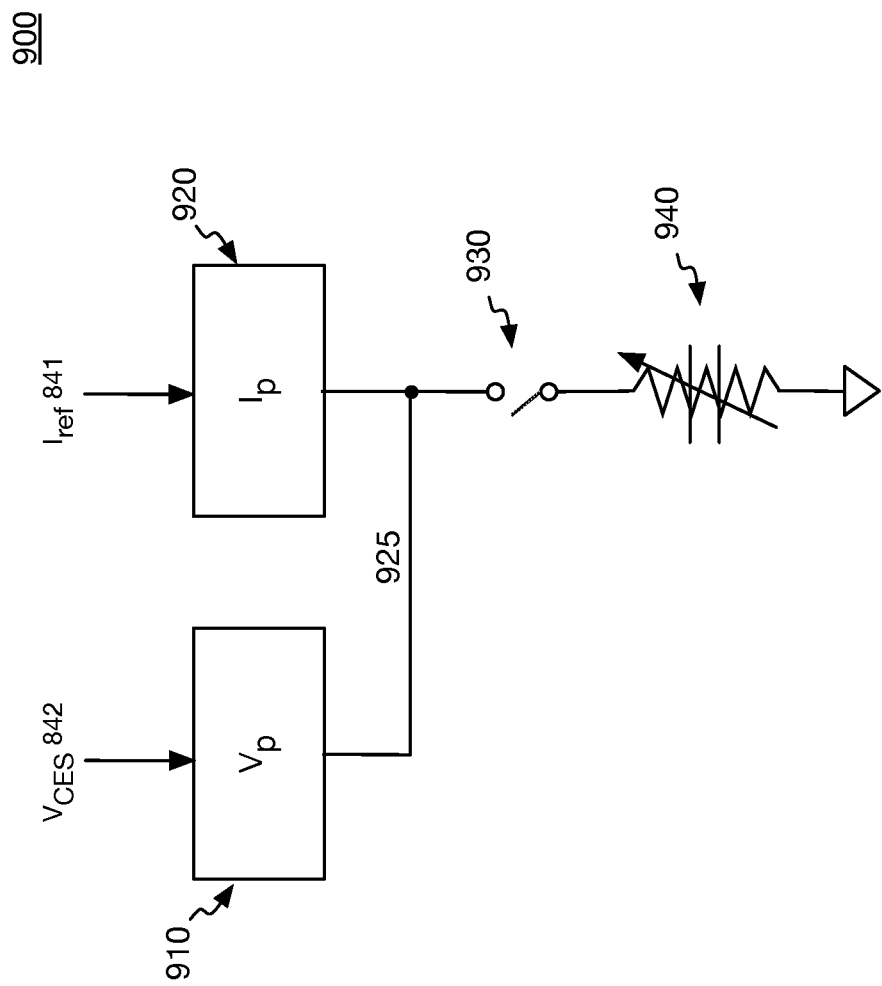
FIG. 9 is a schematic block diagram of an example circuit providing a programmable current and a programmable voltage for a correlated electron switch, in accordance with an embodiment.

FIG. 9 is a schematic block diagram of an embodiment 900 of an example circuit for providing a programmable current and a programmable voltage for a correlated electron switch, in accordance with an embodiment. As describe above in connection with FIG. 8, example circuit 800 may provide a programmable current, such as $I_{ref}$ 841, that may be applied to one or more variable impeder devices, in an embodiment. As also described above in connection with FIG. 8, example circuit 800 may also generate an output voltage signal, such as $V_{CES}$ 842, to provide voltages for read, set, and/or reset conditions for one or more variable impeder devices, in an embodiment. In an embodiment, example circuit 900 may combine $I_{ref}$ 841 and $V_{CES}$ 842, and may apply the combined signal to one or more variable impeder devices, such as CES 940.

For example, a programmable voltage, such as $V_{CES}$ 842, may be received at a programmable voltage unit 910. A programmable current, such as $I_{ref}$ 841, may be received at a programmable current unit 920, in an embodiment. In an embodiment, programmable voltage unit 910 and programmable current unit 920 may simply comprise electrically conductive paths to a circuit node, such as node 925, where the programmable voltage and programmable current signals may be combined. In another embodiment, programmable current unit 920 and/or programmable voltage unit 910 may include circuitry to control and/or modify a programmable current, such as $I_{ref}$ 841, and/or a programmable voltage, such as $V_{CES}$ 842. For example, programmable voltage unit 910 and/or programmable current unit 920 may include one or more conductive elements, such as one or more transistors, that may enable or disable the voltage and/or current signals in accordance with one or more enable signals. However, claimed subject matter is not limited in scope in this respect.

For example circuit 900, a programmable voltage signal, such as $V_{CES}$ 842, may be applied to a variable impeder device, such as CES 940, to help ensure that sufficient voltage appropriate for either set and/or reset conditions is applied to CES 940 during write operations. Additionally, a programmable current signal, such as $I_{ref}$ 841, may be combined at node 925 with a programmable voltage signal, such as $V_{CES}$ 842, to help ensure that sufficient current flows through CES 940 during write operations to successfully program CES 940 to enter either a conductive/lower impedance state or an insulative/higher impedance state, depending whether a set or reset operation is specified. Also, in an embodiment, a switch, such as switch 930, may be employed to control, at least in part, the application of the combined programmable current and programmable voltage signals to CES 940. In an embodiment, switch 930 may comprise a transistor that may couple node 925 to CES device 940 in response to an assertion of an enable signal, for example. Of course, claimed subject matter is not limited to the specific examples described herein, and other embodiments with other circuit configurations and/or other circuit elements are possible.

In the preceding description, various aspects of claimed subject matter have been described. For purposes of explanation, specifics, such as amounts, systems and/or configurations, as examples, were set forth. In other instances, well-known features were omitted and/or simplified so as not to obscure claimed subject matter. While certain features have been illustrated and/or described herein, many modifications, substitutions, changes and/or equivalents will now occur to those skilled in the art. It is, therefore, to be understood that the appended claims are intended to cover all modifications and/or changes as fall within claimed subject matter.

What is claimed is:

1. A method, comprising:
providing a programmable current specified at least in part by a digital code to a correlated electron switch device to place the correlated electron switch device in a first particular impedance state of a plurality of impedance states, wherein a first plurality of bits of the digital code to specify a coarse tuning of the programmable current and wherein a second plurality of bits of the digital code to further specify a fine tuning of the programmable current to enable a subsequent transition in the correlated electron switch device from the first particular impedance state to a second particular impedance state of the plurality of impedance states.

2. The method of claim 1, further comprising generating the programmable current specified at least in part by the digital code.

3. The method of claim 2, wherein the generating the programmable current specified at least in part by the digital code comprises controlling the programmable current to a specified compliance current level.

4. The method of claim 3, wherein the generating the programmable current specified at least in part by the first plurality of bits of the digital code comprises generating a current sufficient to achieve a set condition in the correlated electron switch device.

5. The method of claim 4, wherein the generating the current sufficient to achieve the set condition comprises generating a current limited to the specified compliance current level to establish a particular threshold current density level in the correlated electron switch device for a subsequent operation to transition the correlated electron switch device from the first particular impedance state of the plurality of impedance states to the second particular impedance state of the plurality of impedance states.

6. The method of claim 5, further comprising performing the subsequent operation to transition the correlated electron switch device from the first particular impedance state to the second particular impedance state including generating the programmable current at least in part in accordance with the second plurality of bits of the digital code, including generating a current sufficient to achieve a reset condition to transition the correlated electron switch device from the second particular impedance state to the first particular impedance state.

7. The method of claim 2, wherein the generating the programmable current specified at least in part by the digital code comprises generating a programmable current having a level that is a multiple of a unit current level, wherein the multiple is determined at least in part by the digital code.

8. The method of claim 1, wherein the first and second particular impedance states respectively include particular approximate resistance and capacitance characteristics, wherein the capacitance of the second particular impedance state exceeds the capacitance of the first particular impedance state.

9. The method of claim 1, wherein the digital code specifies a particular current level of a plurality of current levels available from a programmable current source.

10. The method of claim 1, wherein the second plurality of bits of the digital code to further specify the fine tuning of the programmable current to compensate for variations in process, voltage or temperature, or a combination thereof, for the correlated electron switch device.

11. An apparatus, comprising:
a programmable current source to generate a programmable current specified at least in part by a digital code to place a correlated electron switch device in a first particular impedance state of a plurality of impedance states, wherein a first plurality of bits of the digital code to specify a coarse tuning of the programmable current and wherein a second plurality of bits of the digital code to further specify a fine tuning of the programmable current to enable a subsequent transition in the correlated electron switch device from the first particular impedance state to a second particular impedance state of the plurality of impedance states.

12. The apparatus of claim 11, wherein, to generate the programmable current specified at least in part by the first plurality of bits of the digital code, the programmable current source to generate a current sufficient to achieve a set condition in the correlated electron switch device.

13. The apparatus of claim 12, wherein, to generate the current sufficient to achieve the set condition, the programmable current source to generate a current limited to a specified compliance current level to establish a particular threshold current density level in the correlated electron switch device for a subsequent operation to transition the correlated electron switch from the first particular impedance state to the second particular impedance state.

14. The apparatus of claim 13, wherein the programmable current source further to subsequently generate the programmable current at least in part in accordance with the second plurality of bits of the digital code, wherein the programmable current source to generate a current sufficient to achieve a reset condition to transition the correlated electron switch device from the first particular impedance state to the second particular impedance state.

15. The apparatus of claim 11, wherein, to generate the programmable current specified at least in part by the digital code, the programmable current source to generate a programmable current having a level that is a multiple of a unit current level, wherein the multiple is determined at least in part by the digital code.

16. The apparatus of claim 11, wherein the first and second impedance states respectively to include particular approximate resistance and capacitance characteristics, wherein the capacitance of the second particular impedance state to exceed the capacitance of the first particular impedance state.

17. The apparatus of claim 11, wherein the second plurality of bits of the digital code to further specify the fine tuning of the programmable current to compensate for variations in process, voltage or temperature, or a combination thereof, for the correlated electron switch device.

* * * * *